(12) United States Patent
Luo et al.

(10) Patent No.: US 11,781,790 B2
(45) Date of Patent: Oct. 10, 2023

(54) REFRIGERATING SYSTEM

(71) Applicant: Beijing Baidu Netcom Science and Technology Co., LTD., Beijing (CN)

(72) Inventors: Zhiming Luo, Beijing (CN); Yiyi Duan, Beijing (CN); Bin Yi, Beijing (CN); Xiaozhong Li, Beijing (CN)

(73) Assignee: Beijing Baidu Netcom Science and Technology Co., Ltd., Beijing (CN)

( * ) Notice: Subject to any disclaimer, the term of this patent is extended or adjusted under 35 U.S.C. 154(b) by 182 days.

(21) Appl. No.: 17/206,727

(22) Filed: Mar. 19, 2021

(65) Prior Publication Data
US 2021/0207855 A1 Jul. 8, 2021

(30) Foreign Application Priority Data

Jun. 11, 2020 (CN) .......................... 202010530689.4
Jun. 11, 2020 (CN) .......................... 202021077135.5

(51) Int. Cl.
*F25B 13/00* (2006.01)
*F25B 49/02* (2006.01)

(52) U.S. Cl.
CPC .............. *F25B 13/00* (2013.01); *F25B 49/02* (2013.01)

(58) Field of Classification Search
CPC ................................ F25B 13/00; F25B 49/02
See application file for complete search history.

(56) References Cited

U.S. PATENT DOCUMENTS

| 5,211,023 | A | * | 5/1993 | Matsuura | .................. F25B 5/02 62/201 |
| 8,286,442 | B2 | * | 10/2012 | Carlson | .............. H05K 7/20827 62/259.2 |
| 2010/0107658 | A1 | * | 5/2010 | Cockrell | ............ H05K 7/20827 62/62 |
| 2015/0300675 | A1 | * | 10/2015 | Hamada | .................. F24F 11/89 62/203 |
| 2017/0344855 | A1 | | 11/2017 | Mande et al. | |
| 2018/0295752 | A1 | * | 10/2018 | Tang | .................. H05K 7/20827 |

(Continued)

FOREIGN PATENT DOCUMENTS

CN 205939415 U 2/2017
CN 107305740 A 10/2017
(Continued)

OTHER PUBLICATIONS

Apr. 18, 2022—(JP)—Office Action—App. No. 2021-086787.
(Continued)

*Primary Examiner* — Henry T Crenshaw
(74) *Attorney, Agent, or Firm* — Banner & Witcoff, Ltd.

(57) ABSTRACT

A refrigeration system is provided. The refrigeration system includes: an indoor heat exchange module configured for refrigerant to absorb heat; outdoor heat exchange modules for the refrigerant to dissipate heat. The outdoor heat exchange module includes a compression device and a condensing device; the outdoor heat exchange module is switchable between an active mode and a standby mode; in the active mode, the outdoor heat exchange module is connected to the indoor heat exchange module; in the standby mode, the outdoor heat exchange module is disconnected from the indoor heat exchange module, and the compression device of the outdoor heat exchange module is in an operation status.

12 Claims, 5 Drawing Sheets

(56) References Cited

U.S. PATENT DOCUMENTS

2019/0367020 A1    12/2019    Yan et al.
2021/0222923 A1*    7/2021    Luo ..................... F25B 6/02

FOREIGN PATENT DOCUMENTS

| | | | |
|---|---|---|---|
| CN | 107368890 | A | 11/2017 |
| CN | 107757613 | A | 3/2018 |
| CN | 108010388 | A | 5/2018 |
| CN | 207422534 | U | 5/2018 |
| CN | 109960261 | A | 7/2019 |
| CN | 110160185 | * | 8/2019 |
| CN | 110567199 | * | 9/2019 |
| CN | 209371582 | U | 9/2019 |
| CN | 210463636 | * | 5/2020 |
| CN | 214501782 | * | 10/2021 |
| CN | 113803910 | A | 12/2021 |
| JP | H11294879 | A | 10/1999 |
| JP | 2009019875 | A | 1/2009 |
| JP | 2009243828 | A | 10/2009 |
| JP | 2010025466 | A | 2/2010 |
| JP | 2011196629 | A | 10/2011 |
| JP | 2011247491 | A | 12/2011 |
| JP | 2012172920 | A | 9/2012 |
| JP | 2014185832 | A | 10/2014 |
| JP | 2016192146 | A | 11/2016 |
| JP | 2017040459 | A | 2/2017 |
| JP | 2017106653 | A | 6/2017 |
| JP | 2018055141 | A | 4/2018 |
| JP | 2018197613 | A | 12/2018 |
| WO | 2014073150 | A1 | 5/2014 |

OTHER PUBLICATIONS

Sep. 2, 2021—(EP)—EESR—App. No. 21163775.6.
Mar. 16, 2023—(CN) First Office Action—App. No. 2019113356163, w/ translation—pp. 1-15.
Mar. 14, 2023—(CN) First Examination Report—App. No. 2019113356163, w/ translation—pp. 1-7.

* cited by examiner

REFRIGERATING SYSTEM

CROSS-REFERENCE TO RELATED APPLICATION

This application claims priorities to Chinese patent applications No. 202010530689.4 and No. 202021077135.5, filed on Jun. 11, 2020, both of which are incorporated herein by reference in their entireties.

TECHNICAL FIELD

The present application relates to the technical field of heat exchange, in particular to the technical field of cooling for data centers that may be used for applications (including but not limited to) such as cloud computing, cloud storage, big data computing, deep learning and image processing.

BACKGROUND

With the development of internet technology, cooling requirements for data centers that may be used for applications (including but not limited to) such as cloud computing, cloud storage, big data computing, deep learning and image processing have become higher and higher in recent years.

SUMMARY

The present application provides a refrigeration system.

The refrigeration system of the present application includes:

an indoor heat exchange module configured for refrigerant to absorb heat; and outdoor heat exchange modules configured for the refrigerant to dissipate heat; the outdoor heat exchange module including a compression device and a condensing device; the outdoor heat exchange module being switchable between an active mode and a standby mode; in the active mode, the outdoor heat exchange module being connected to the indoor heat exchange module; in the standby mode, the outdoor heat exchange module being disconnected from the indoor heat exchange module, and the compression device of the outdoor heat exchange module being in an operation status;

wherein some of the outdoor heat exchange modules are in the active mode, and the other are in the standby mode.

In an embodiment, the compression device includes an air suspension compressor; the air suspension compressor is connected between an output terminal of the indoor heat exchange module and an input terminal of the condensing device; and wherein the compression device further includes an air supply circulation pipeline connected to the air suspension compressor; when the outdoor heat exchange module is in the standby mode, the air suspension compressor of the outdoor heat exchange module is connected to the air supply circulation pipeline and drives the refrigerant to circulate in the air supply circulation pipeline.

In an embodiment, the outdoor heat exchange module further includes a liquid storage portion; and the liquid storage portion is connected between an output terminal of the condensing device and an input terminal of the indoor heat exchange module, and is configured to store the refrigerant output from the condensing device;

wherein the air supply circulation pipeline includes a liquid conversion portion, a first liquid pump and a gas conversion portion which are sequentially connected in a direction from an output terminal to an input terminal of the air suspension compressor; the liquid conversion portion is configured to convert the refrigerant output by the air suspension compressor from a gas state to a liquid state, and deliver the refrigerant to the liquid storage portion; the gas conversion portion is connected between the liquid storage portion and the input terminal of the gas suspension compressor, and is configured to convert the refrigerant in the liquid storage portion from the gas state to the liquid state; the first liquid pump is connected between the liquid storage portion and the gas conversion portion, and is configured to pump the refrigerant in the liquid storage portion to the gas conversion portion; and wherein both the first liquid pump and the air suspension compressor are powered by an uninterruptible power system.

In an embodiment, the air supply circulation pipeline further includes a first on-off valve configured to switch on or off the air supply circulation pipeline;

wherein a second liquid pump and a second on-off valve are provided between the liquid storage portion and the indoor heat exchange module; the second liquid pump is configured to pump the refrigerant in the liquid storage portion to the indoor heat exchange module; the second on-off valve is configured to switch on or off a refrigerant delivery pipe between the liquid storage portion and the indoor heat exchange module; and wherein, when the outdoor heat exchange module is in the active mode, the first on-off valve is turned off and the second on-off valve is turned on; and when the outdoor heat exchange module is in the standby mode, the first on-off valve is turned on and the second on-off valve is turned off.

In an embodiment, the condensing device includes:

a condensing coil, an input terminal of the condensing coil being connected to an output terminal of the compression device, and an output terminal of the condensing coil being connected to an input terminal of the indoor heat exchange module;

a spray device configured to spray cooling water to the condensing coil, so that the refrigerant in the condensing coil is converted from a gas state to a liquid state.

In an embodiment, the refrigeration system further includes a refrigerant delivery pipe network, which is connected between the outdoor heat exchange module and the indoor heat exchange module and is configured to deliver the refrigerant between the outdoor heat exchange module and the indoor heat exchange module.

In an embodiment, the refrigerant delivery pipe network includes a first delivery pipe network and a second delivery pipe network; an output terminal of the outdoor heat exchange module is connected with an input terminal of the indoor heat exchange module through the first delivery pipe network; and an output terminal of the indoor heat exchange module is connected with an input terminal of the outdoor heat exchange module through the second delivery pipe network.

In an embodiment, the outdoor heat exchange module further includes a third on-off valve and a fourth on-off valve; the third on-off valve is provided between the output terminal of the outdoor heat exchange module and the first delivery pipe network; and the fourth on-off valve is provided between the input terminal of the outdoor heat exchange module and the second delivery pipe network;

wherein, when the outdoor heat exchange module is in the active mode, the third on-off valve and the fourth on-off valve are both tuned on; and when the outdoor heat exchange module is in the standby mode, the third on-off valve and the fourth on-off valves are both turned off.

In an embodiment, the indoor heat exchange module includes a plurality of plate heat exchangers; input terminals of the plurality of plate heat exchangers are connected in parallel to the first delivery pipe network; and output terminals of the plurality of plate heat exchangers are connected in parallel to the second delivery pipe network.

In an embodiment, the number of outdoor heat exchange modules is greater than the number of indoor heat exchange modules; among the outdoor heat exchange modules, the number of outdoor heat exchange modules in the active mode is M, and the number of outdoor heat exchange modules in the standby mode is N; and wherein, when M<6, N=1; when M≥6, N=2.

It should be understood that the contents in this section are not intended to identify the key or critical features of the embodiments of the present application, and are not intended to limit the scope of the present application. Other features of the present application will become readily apparent from the following description.

BRIEF DESCRIPTION OF THE DRAWINGS

With reference to the drawings and the following detailed description, the foregoing and other features, advantages and aspects of the embodiments of the present application will become more apparent. In the drawings, the same or similar reference sign represents the same or similar element. Wherein.

DETAILED DESCRIPTION

The exemplary embodiments of the present application are described below with reference to the accompanying drawings, which include various details of the embodiments of the present application to facilitate understanding, and should be considered as merely exemplary. Accordingly, a person skilled in the art should appreciate that various changes and modifications can be made to the embodiments described herein without departing from the scope and spirit of the present application. Also, descriptions of well-known functions and structures are omitted from the following description for clarity and conciseness.

In related art, a cooling scheme of the data center mostly adopts the conventional chilled water data center design scheme, but an overall energy saving effect is poor; while a large phase change system with better energy saving effect has defects such as poor stability and inability to meet continuous cooling requirements of the data center.

A refrigeration system 1 according to an embodiment of the present application will be described hereinafter with reference to FIGS. 1-5. The refrigeration system 1 according to the embodiment of the present application may be used to provide refrigeration to a data center, so that units of the data center can operate at an appropriate temperature.

Figure 1:
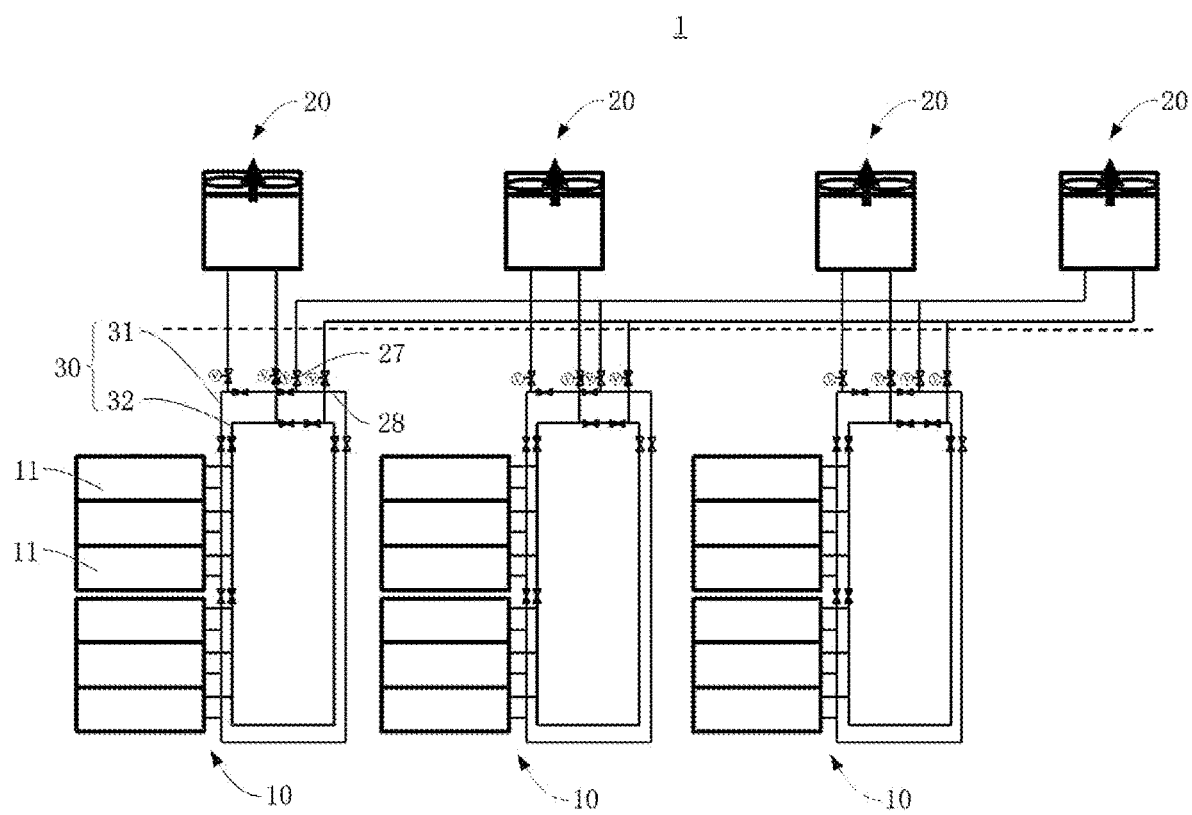
FIG. 1 is a schematic structural diagram of a refrigeration system according to an embodiment of the present application.

FIG. 1 is a schematic structural diagram of a refrigeration system 1 according to an embodiment of the present application. As shown in FIG. 1, the refrigeration system 1 includes an outdoor heat exchange module 20 and an indoor heat exchange module 10.

Specifically, the indoor heat exchange module 10 is used for refrigerant to absorb heat, and the outdoor heat exchange module 20 is used for the refrigerant to dissipate heat. It is understood that the refrigerant in the indoor heat exchange module 10 can exchange heat with indoor air and absorb heat in the indoor air to reduce an indoor temperature, thereby achieving the purpose of cooling; the heated refrigerant dissipates heat in the outdoor heat exchange module 20, thereby dissipating heat of the refrigerant to the outdoor atmosphere; and then the cooled refrigerant flows back to the indoor heat exchange module 10. In this cycle, circulation flow of the refrigerant between the indoor heat exchange module 10 and the outdoor heat exchange module 20 is completed.

The outdoor heat exchange module 20 includes a compression device 20a and a condensing device 23. The compression device 20a is used to compress a low-temperature and low-pressure gaseous refrigerant output from the indoor heat exchange module 10 into a high-temperature and high-pressure gaseous refrigerant. The high-temperature and high-pressure gaseous refrigerant is condensed in the condensing device 23 to convert the refrigerant from a gas state to a liquid state. Then the liquid refrigerant flows back to an input terminal of the indoor heat exchange module 10, and the liquid refrigerant absorbs heat in the indoor heat exchange module 10 and is converted into gaseous refrigerant, and flows back to the compression device 20a.

The outdoor heat exchange module 20 may be switched between an active mode and a standby mode. In the active mode, the outdoor heat exchange module 20 is connected to the indoor heat exchange module 10; in the standby mode, the outdoor heat exchange module 20 is disconnected from the indoor heat exchange module 10, and the compression device 20a of the outdoor heat exchange module 20 is in an operation status. Some of multiple outdoor heat exchange modules 20 are in the active mode, and the others are in the standby mode. It is understood that the outdoor heat exchange module 20 in the active mode means that the outdoor heat exchange module 20 is currently used, that is, the refrigerant dissipates heat in the outdoor heat exchange module 20 and flows back to the indoor heat exchange module 10 to absorb heat; the outdoor heat exchange module 20 in the standby mode means that the outdoor heat exchange module 20 is currently unused, that is, the refrigerant does not dissipate heat in the outdoor heat exchange module 20 or the refrigerant after heat dissipation does not flow back to the indoor heat exchange module 10.

In an example, there are a plurality of outdoor heat exchange modules 20, wherein the number of outdoor heat exchange modules 20 in the active mode and the number of indoor heat exchange modules 10 are set in one-to-one correspondence, that is, a plurality of outdoor heat exchange modules in the active mode are connected to a plurality of indoor heat exchange modules 10 in a one-to-one manner, so that the refrigerant circulates between the connected outdoor heat exchange module 20 and the indoor heat exchange module 10. The outdoor heat exchange module 20 in the standby mode is in a standby state, that is, the compression device 20*a* of the outdoor heat exchange module 20 is in an operation state, and the refrigerant circulates only in the compression device 20*a*.

Thus, when one outdoor heat exchange module 20 in the active mode fails, the one outdoor heat exchange module 20 may be switched to the standby mode to disconnect the one outdoor heat exchange module 20 from the indoor heat exchange module 10. Meanwhile, another outdoor heat exchange module 20 in the standby mode is switched to the active mode and connected to the indoor heat exchange module 10 to replace the one outdoor heat exchange module 20 that has failed. It should be noted that when one outdoor heat exchange module 20 is in the standby mode, its compression device 20*a* operates continuously. Thus, when one outdoor heat exchange module 20 is switched to the active mode, the outdoor heat exchange module 20 can provide cooling capacity to the indoor heat exchange module 10 in a timely manner to ensure that the cooling capacity is continuously provided to the indoor heat exchange module 10, which avoids insufficient cooling capacity caused by start-up time of a compressor when the outdoor heat exchange module 20 is switched from the standby mode to the active mode, thereby realizing continuous cooling of the refrigeration system 1 and then ensuring operation stability of the data center.

Figure 2:
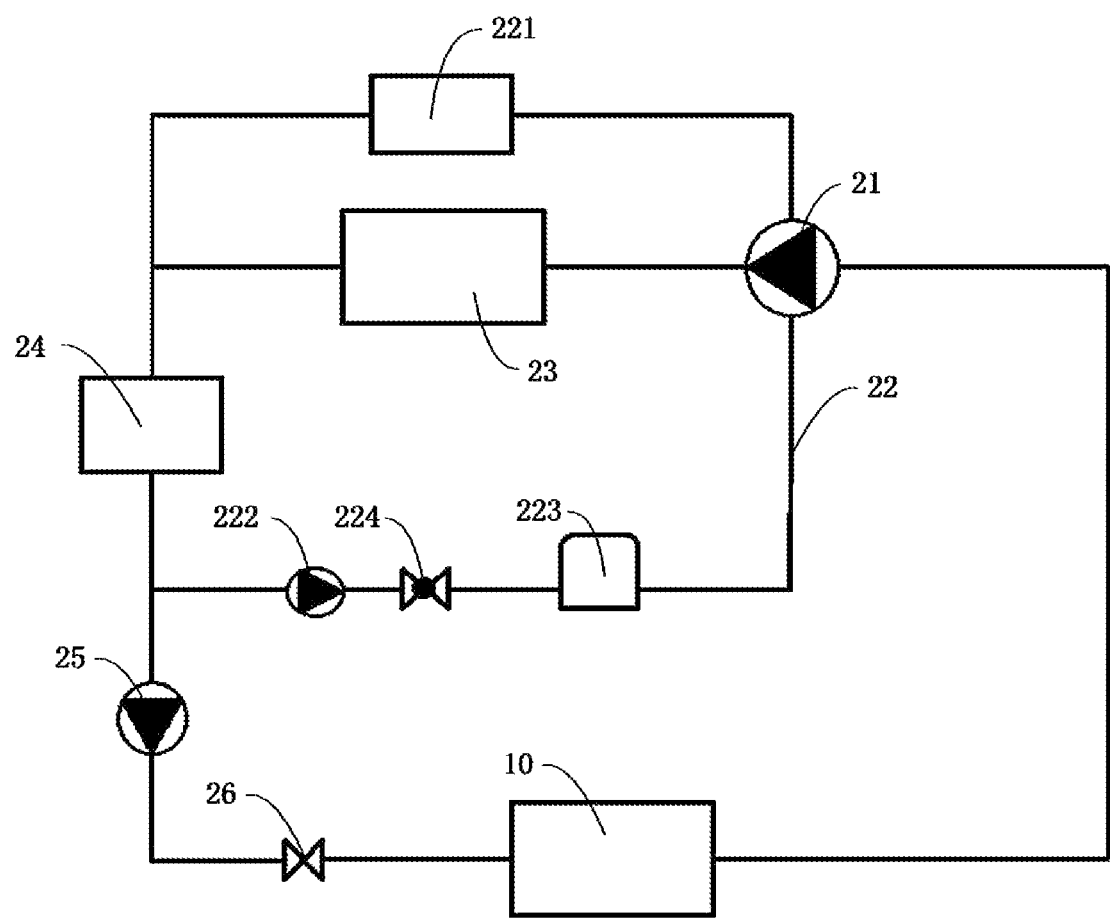
FIG. 2 is an operation principle diagram of a refrigeration system according to an embodiment of the present application.

In an embodiment, as shown in FIG. 2, the compression device 20*a* includes an air suspension compressor 21. The air suspension compressor 21 is connected between an output terminal of the indoor heat exchange module 10 and an input terminal of the condensing device 23. It should be noted that the air suspension compressor 21 is an oil-free compressor, that is, a cylinder of the air suspension compressor 21 does not contain lubricating oil. In this way, in the process of circulating the refrigerant between the indoor heat exchange module 10 and the outdoor heat exchange module 20, there is no need to consider the oil return problem of the compressor, thereby solving the technical problem that the compressor of the refrigeration system 1 in the related art is difficult to ensure the oil return effect due to a long flow path of the refrigerant, which affects the stability of the refrigeration system 1. Therefore, the refrigeration system 1 according to the embodiment of the present application adopts the air suspension compressor 21 without having to consider the oil return problem of the compressor, and has advantages such as stable operation and low equipment cost.

Moreover, the compression device 20*a* further includes an air supply circulation pipeline 22 connected to the air suspension compressor 21. When the outdoor heat exchange module 20 is in the standby mode, the air suspension compressor 21 of the outdoor heat exchange module 20 is connected to the air supply circulation pipeline 22 and drives the refrigerant to circulate in the air supply circulation pipeline 22. It can be understood that in the outdoor heat exchange module 20 in the standby mode, the gaseous refrigerant continuously passes through the air suspension compressor 21 through the air supply circulation pipeline 22, so that bearings of the air suspension compressor 21 are in a suspended state, thereby ensuring that the air suspension compressor 21 can be in a continuous operation state. In this way, when the outdoor heat exchange module 20 is switched from the standby mode to the active mode, there is no need to wait for the start-up time of the air suspension compressor 21, and the refrigerant can directly circulate between the outdoor heat exchange module 20 and the indoor heat exchange module 10, thereby ensuring heat exchange effects of the refrigerant in the outdoor heat exchange module 20 and the indoor heat exchange module 10.

In an embodiment, as shown in FIG. 2, the outdoor heat exchange module 20 further includes a liquid storage portion 24. The liquid storage portion 24 is connected between the output terminal of the condensing device 23 and the input terminal of the indoor heat exchange module 10, and is used to store the refrigerant output from the condensing device 23. The air supply circulation pipeline 22 includes a liquid conversion portion 221, a first liquid pump 222 and a gas conversion portion 223 which are sequentially connected in a direction from an output terminal to an input terminal of the air suspension compressor 21. The liquid conversion portion 221 is used to convert the refrigerant output by the air suspension compressor 21 from a gas state to a liquid state, and deliver it to the liquid storage portion 24. The gas conversion portion 223 is connected between the liquid storage portion 24 and the input terminal of the gas suspension compressor 21, and is used to convert the refrigerant in the liquid storage portion 24 from a gas state to a liquid state. The first liquid pump 222 is connected between the liquid storage portion 24 and the gas conversion portion 223, and is used to pump the refrigerant in the liquid storage portion 24 to the gas conversion portion 223. Both the first liquid pump 222 and the air suspension compressor 21 are powered by an uninterruptible power system (UPS), so that the air suspension compressor 21 can run uninterruptedly when the outdoor heat exchange module 20 is in the standby mode.

In an example, when the outdoor heat exchange module 20 is in the standby mode, the air suspension compressor 21 is connected to the air supply circulation pipeline 22, and the liquid conversion portion 221 is used to replace the condensing device 23. The liquid conversion portion 221 may be a condenser, i.e., to condense the gaseous refrigerant output by the air suspension compressor 21 into a liquid state, and then deliver it to the liquid storage portion 24. After the first liquid pump 222 transports the liquid refrigerant in the liquid storage portion 24 to the gas conversion portion 223, the liquid refrigerant is converted into a gas state. The gas conversion portion 223 may be a gas supply tank, and a heating device may be provided in the gas supply tank for heating the refrigerant to convert the refrigerant from a liquid state to a gas state which is then delivered to the input terminal of the air suspension compressor 21 for circulation. Both the first liquid pump 222 and the air suspension compressor 21 are continuously powered by an uninterruptible power system. It is understood that an uninterruptible power system is an uninterruptible power system containing an energy storage device. When the mains input is normal, the uninterruptible power system will stabilize the mains and supply it to the load (i.e., the first liquid pump 222 and the air suspension compressor 21) for use. At this point, the uninterruptible power system is equivalent to an alternating current voltage stabilizer, and it also charges a battery therein. When the mains power is interrupted (accidental power failure), the uninterruptible power system will immediately continue to supply 220V alternating current power to the load by switching and converting the direct current power of the battery through an inverter, thereby enabling the load to maintain normal operation and protecting software and hardware of the load from being damaged. The uninterruptible power system usually provides protection against high voltage or low voltage.

In an embodiment, the number of outdoor heat exchange modules 20 is greater than the number of indoor heat exchange modules 10. Among a plurality of outdoor heat exchange modules 20, the number of outdoor heat exchange modules 20 in the active mode is M, and the number of outdoor heat exchange modules 20 in the standby mode is N.

The number of indoor heat exchange modules 10 is the same as the number M of outdoor heat exchange modules 20 in the active mode and is set in one-to-one correspondence. When M<6, N=1; when M≥6, N=2. Therefore, when the number of indoor heat exchange modules 10 is large (for example, when M two outdoor heat exchange modules 20 may be set as standbys, to meet cooling capacity requirements of the indoor heat exchange modules 10 corresponding to the outdoor heat exchange modules 20 that have failed when two or more of the outdoor heat exchange modules 20 in the active mode fail, thereby ensuring the cooling effect of the refrigeration system 1 on the data center.

In an example, as shown in FIG. 1, the number of outdoor heat exchange modules 20 may be four, wherein three outdoor heat exchange modules 20 are in the active mode, and the other outdoor heat exchange module 20 is in the standby mode. The number of indoor heat exchange modules 10 may be three and the three indoor heat exchange modules may be set in one-to-one correspondence with the three outdoor heat exchange modules 20 in the active mode. When switching to the active mode, the outdoor heat exchange module 20 in the standby mode may be connected with any one of the three indoor heat exchange modules 10.

In an embodiment, as shown in FIG. 2, the air supply circulation pipeline 22 further includes a first on-off valve 224 for switching on-off the air supply circulation pipeline 22, i.e., turning on or off the air circulation pipeline. For example, the first on-off valve 224 may be an electromagnetic valve and is provided between the first liquid pump 222 and the gas conversion portion 223. By controlling opening or closing of the electromagnetic valve, the first liquid pump 222 and the gas conversion portion 223 are connected or disconnected.

Further, a second liquid pump 25 and a second on-off valve 26 are provided between the liquid storage portion 24 and the indoor heat exchange module 10. The second liquid pump 25 is used to pump the refrigerant in the liquid storage portion 24 to the indoor heat exchange module 10, and the second on-off valve 26 is used to switch on or off a refrigerant delivery pipe between the liquid storage portion 24 and the indoor heat exchange module 10. For example, the second on-off valve 26 may be an electronic expansion valve and is provided between the second liquid pump 25 and the indoor heat exchange module 10. It can be understood that the electronic expansion valve may use an electrical signal generated by adjusting parameters to control a voltage or current applied to the electronic expansion valve, thereby achieving the purpose of adjusting a flow rate of liquid refrigerant delivered by the second liquid pump 25 to the indoor heat exchange module 10.

When the outdoor heat exchange module 20 is in the active mode, the first on-off valve 224 is turned off and the second on-off valve 26 is turned on. As a result, the air supply circulation pipeline 22 is turned off, and the outdoor heat exchange module 20 is connected to the indoor heat exchange module 10, so that the refrigerant circulates through the air suspension compressor 21, the condenser and the indoor heat exchange module 10 by the second liquid pump 25 and the second on-off valve 26. When the outdoor heat exchange module 20 is in the standby mode, the first on-off valve 224 is turned on and the second on-off valve 26 is turned off. As a result, the outdoor heat exchange module 20 is disconnected from the indoor heat exchange module 10, and the air suspension compressor 21 is connected to the air supply circulation pipeline 22, and the first liquid pump 222 and the air suspension compressor 21 are continuously powered by the uninterrupted power system. In this way, the refrigerant passing through the air suspension compressor 21 circulates in the air supply circulation pipeline 22, thereby ensuring continuous operation of the air suspension compressor 21.

Figure 3:
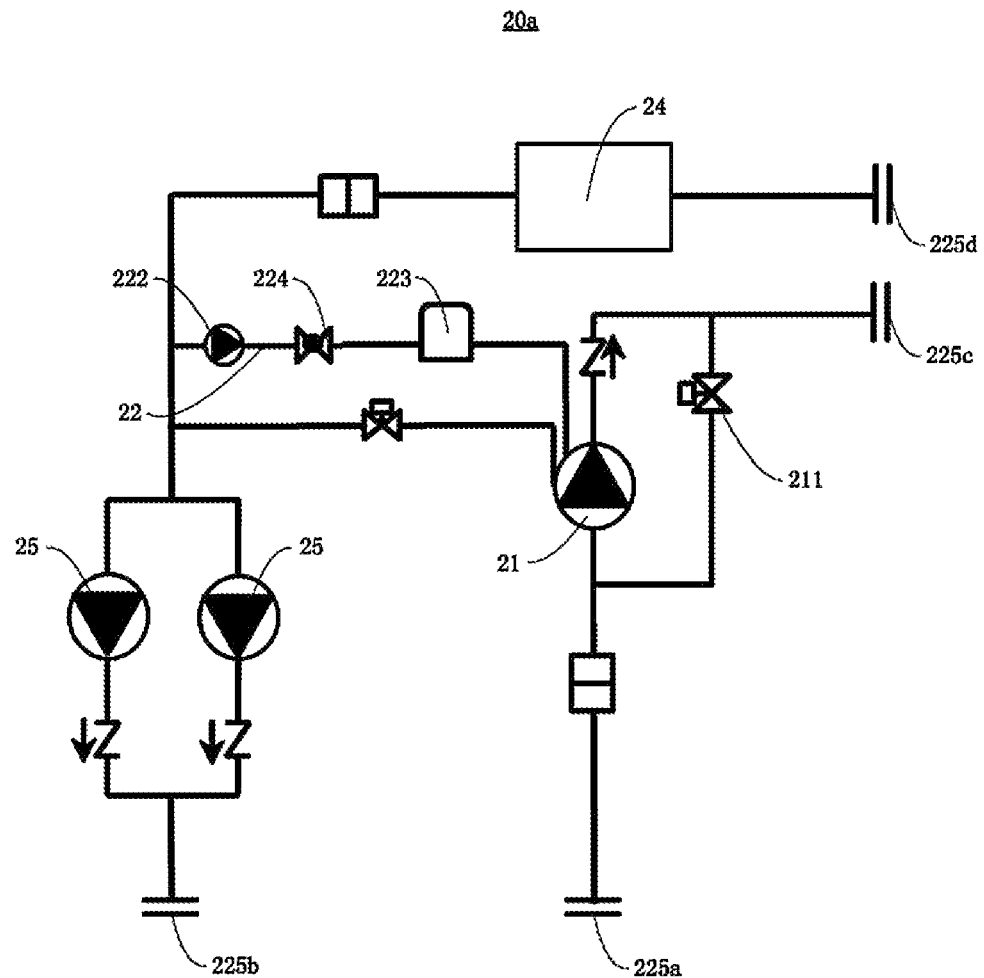
FIG. 3 is a schematic structural diagram of a compression device of a refrigeration system according to an embodiment of the present application.

In a specific example, as shown in FIG. 3, the compression device 20a includes a pump cabinet. The air suspension compressor 21, the liquid storage portion 24, and a part of the air supply circulation pipeline 22 are provided in the pump cabinet. Specifically, the pump cabinet includes a gas refrigerant input terminal 225a, a liquid refrigerant output terminal 225b, a gas refrigerant output terminal 225c, and a liquid refrigerant input terminal 225d. With reference to FIGS. 2-3, the gas refrigerant input terminal 225a and the liquid refrigerant output terminal 225b are used to connect the output terminal and the input terminal of the indoor heat exchange module, respectively. The gas refrigerant output terminal 225c and the liquid refrigerant input terminal 225d are used to connect the input terminal and the output terminal of the condensing device 23, respectively. The input terminal and the output terminal of the liquid conversion portion 221 of the air supply circulation pipeline 22 are also connected to the gas refrigerant output terminal 225c and the liquid refrigerant input terminal 225d, respectively, that is, the liquid conversion portion 221 of the air supply circulation pipeline 22 is arranged in parallel with the condensing device 23.

The first liquid pump 222, the first on-off valve 224 and the gas conversion portion 223 are sequentially connected between the liquid storage portion 24 and the input terminal of the gas suspension compressor 21. A liquid outlet branch is further provided between the liquid storage portion 24 and the liquid refrigerant output terminal, and the second liquid pump 25 is provided in the liquid outlet branch. There may be two second liquid pumps 25 arranged in parallel, thereby improving a delivery efficiency of the liquid refrigerant from the liquid storage portion 24 to the indoor heat exchange module 10. Moreover, a bypass branch is further provided between the output terminal of the air suspension compressor 21 and the gas refrigerant output terminal, and a bypass valve 211 is provided in the bypass branch.

Figure 4:
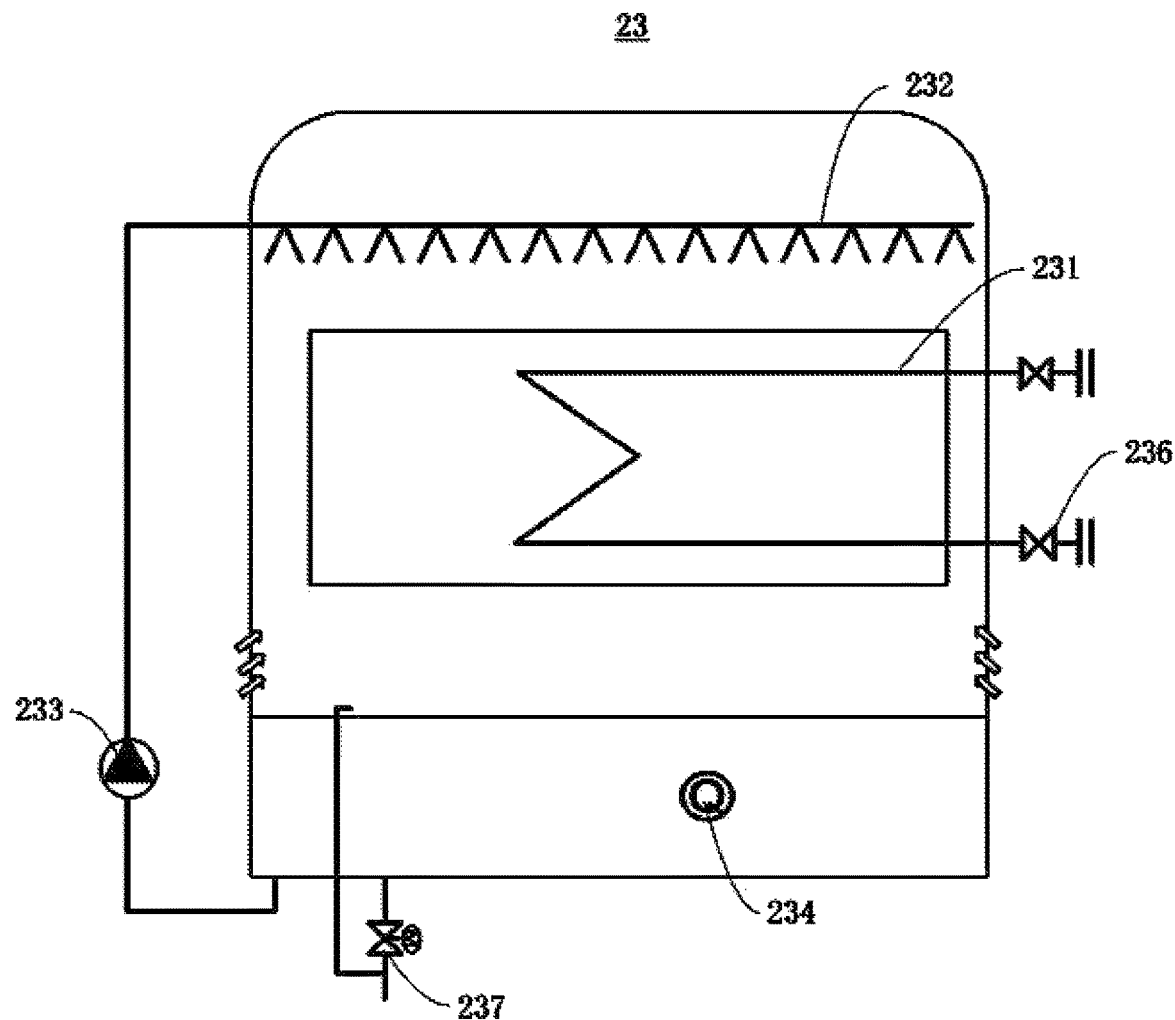
FIG. 4 is a schematic structural diagram of a condensing device of a refrigeration system according to an embodiment of the present application.

In an embodiment, the condensing device 23 may be an evaporative condenser. Specifically, as shown in FIG. 4, the condensing device 23 includes a condensing coil 231 and a spray device 232. An input terminal of the condensing coil 231 is connected to the output terminal of the compression device 20a, and an output terminal of the condensing coil 231 is connected to the input terminal of the indoor heat exchange module 10. The spray device 232 is used to spray cooling water to the condensing coil 231. The high-temperature and high-pressure gaseous refrigerant in the condensing coil 231 exchanges heat with the cooling water, so that the refrigerant in the condensing coil 231 is converted from a gas state to a liquid state. By using an evaporative condenser as the condensing device 23, it has the advantages of good condensing effect and low equipment cost.

In a specific example, the evaporative condenser further includes a spray pump 233 connected to the spray device 232. The spray pump 233 is used to pump the cooling water at the bottom of the evaporative condenser to the spray device 232 at the top of the evaporative condenser. The input and output terminals of the condensing coil 231 are respectively provided with a shut-off valves 236 for turning on or off the input and output terminals of the condensing coil 231, so as to control heat exchange time between the refrigerant in the condensing coil 231 and the cooling water. The evaporative condenser further includes a water quality sensor 234 and a drain valve 237. The water quality sensor 234 is used to detect water quality of the cooling water input to the evaporative condenser. The drain valve 237 is used to control output of the cooling water in the evaporative condenser.

In an embodiment, the refrigeration system 1 further includes a refrigerant delivery pipe network 30, which is connected between the outdoor heat exchange module 20 and the indoor heat exchange module 10 and is used to deliver the refrigerant between the outdoor heat exchange module 20 and the indoor heat exchange module 10. In this way, by controlling the outdoor heat exchange module 20 to be connected to the refrigerant delivery pipe network 30 in the active mode or be disconnected from the refrigerant delivery pipe network 30 in the standby mode, it can be realized that the outdoor heat exchange module 20 is connected to the indoor heat exchange module 10 in the active mode or is disconnected from the indoor heat exchange module 10 in the standby mode. As a result, the pipeline arrangement is convenient and it is convenient to switch the outdoor heat exchange module 20 between the active mode and the standby mode.

In an example, as shown in FIG. 1, there are a plurality of indoor heat exchange modules 10, and a plurality of refrigerant delivery pipe networks 30 are arranged in one-to-one correspondence with the plurality of indoor heat exchange modules 10. The outdoor heat exchange module 20 in the active mode is connected with the corresponding indoor heat exchange module 10 through the refrigerant delivery pipe network 30. The outdoor heat exchange module 20 in the standby mode may be connected to any one of the refrigerant delivery pipe networks 30 of the plurality of indoor heat exchange modules 10, so that when one outdoor heat exchange module 20 in the active mode fails, the outdoor heat exchange module 20 in the standby mode is switched to the active mode and is connected to the refrigerant delivery pipe network 30 of the corresponding indoor heat exchange module 10, thereby replacing the one outdoor heat exchange module 20 that has failed to maintain the cooling requirement of the indoor heat exchange module 10, and then ensuring the cooling effect of the refrigeration system 1.

Figure 5:
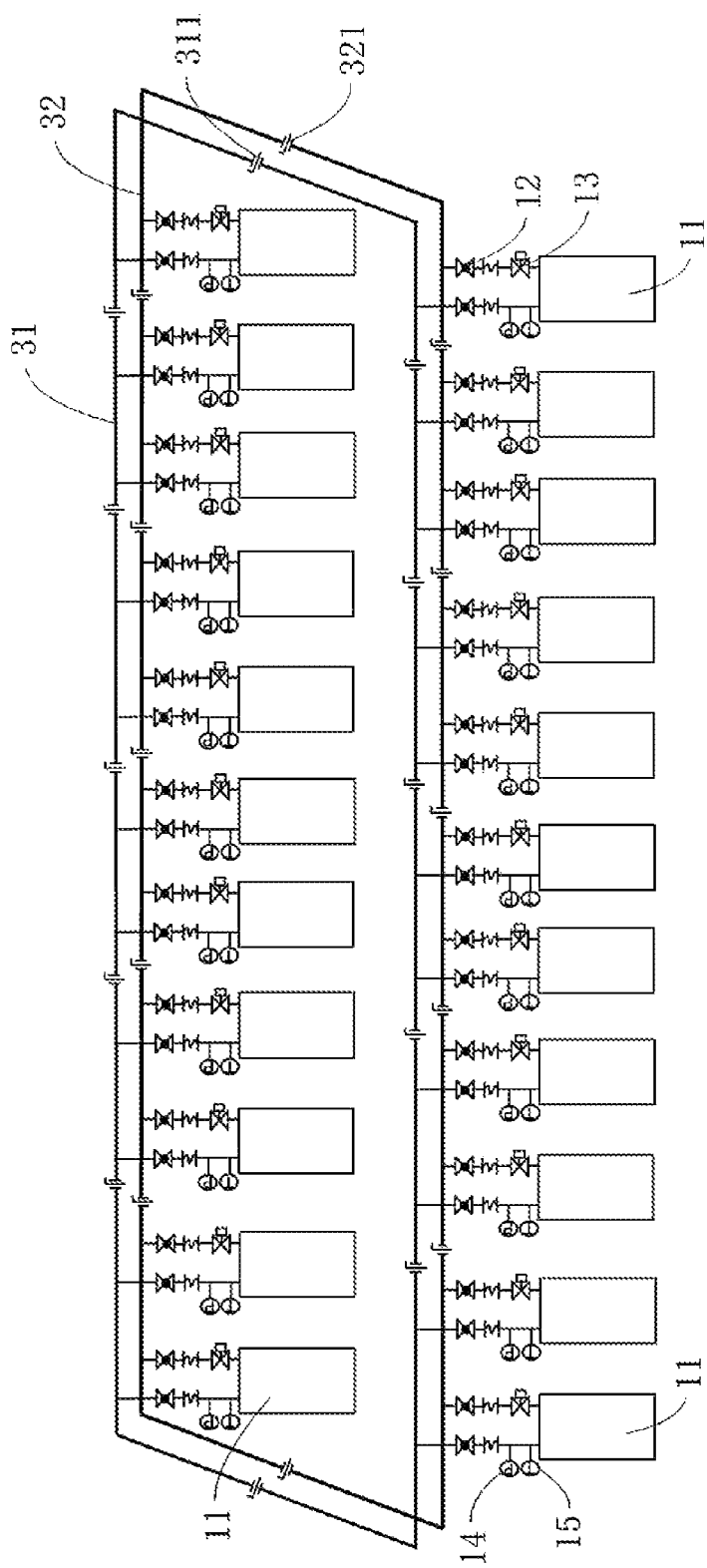
FIG. 5 is a schematic structural diagram of an indoor heat exchange module of a refrigeration system according to an embodiment of the present application.

Optionally, as shown in FIG. 1 and FIG. 5, the refrigerant delivery pipe network 30 includes a first delivery pipe network 31 and a second delivery pipe network 32. The output terminal of the outdoor heat exchange module 20 is connected with the input terminal of the indoor heat exchange module 10 through the first delivery pipe network 31. The output terminal of the indoor heat exchange module 10 is connected with the input terminal of the outdoor heat exchange module 20 through the second delivery pipe network 32. In an example, a first shut-off valve 311 is provided in the first delivery pipe network 31, and a second shut-off valve 321 is provided in the second delivery pipe network 32. It is understood that the first delivery pipe network 31 is used to deliver the liquid refrigerant output from the outdoor heat exchange module 20 to the indoor heat exchange module 10. After the liquid refrigerant absorbs heat and vaporizes in the indoor heat exchange module 10, the gaseous refrigerant is delivered to the outdoor heat exchange module 20 through the second delivery pipe network 32. The gaseous refrigerant is compressed and condensed in the outdoor heat exchange module 20 and then converted into a liquid refrigerant, and then is again delivered to the indoor heat exchange module 10 through the first delivery pipe network 31 for circulation.

Optionally, the outdoor heat exchange module 20 further includes a third on-off valve 27 and a fourth on-off valve 28. The third on-off valve 27 is provided between the output terminal of the outdoor heat exchange module 20 and the first delivery pipe network 31. The fourth on-off valve 28 is provided between the input terminal of the outdoor heat exchange module 20 and the second delivery pipe network 32. When the outdoor heat exchange module 20 is in the active mode, the third on-off valve 27 and the fourth on-off valve 28 are both tuned on. When the outdoor heat exchange module 20 is in the standby mode, the third on-off valve 27 and the fourth on-off valves 28 are both turned off. The third on-off valve 27 and the fourth on-off valve 28 may both be electromagnetic valves. Therefore, the connection between the outdoor heat exchange module 20 and the first delivery pipe network 31, and between the outdoor heat exchange module 20 and the second delivery pipe network 32, are relatively simple, and it is convenient to switch the outdoor heat exchange module 20 between the active mode and the standby mode.

In an embodiment, the indoor heat exchange module 10 includes a plurality of plate heat exchangers 11. Input terminals of the plurality of plate heat exchangers 11 are connected in parallel to the first delivery pipe network 31. Output terminals of the plurality of plate heat exchangers 11 are connected in parallel to the second delivery pipe network 32. In an example, the plate heat exchanger 11 may be installed on a side wall of a cabinet of the data center, thereby improving the cooling effect of the plate heat exchanger 11 on the cabinet. The plate heat exchanger 11 may be a typical copper tube aluminum fin heat exchanger, or may be a microchannel heat exchanger in the field of vehicle air conditioning, which is not specifically limited in the embodiment of the present application. By providing the plurality of plate heat exchangers 11 in the indoor heat exchange module 10, a heat exchange area of the indoor heat exchange module 10 can be increased, thereby ensuring the cooling effect and cooling efficiency of the refrigeration system 1 for the data center.

In an example, a pressure sensor 14 and a temperature sensor 15 are provided in a pipeline connecting the input terminal of the plate heat exchanger 11 and the first delivery pipe network 31, to monitor pressure and temperature of the liquid refrigerant entering the input terminal of the plate heat exchanger 11. A shut-off ball valve 12 and an electronic expansion valve 13 are provided in a pipeline connecting the output terminal of the plate heat exchanger 11 and the second delivery pipe network 32, to turn on or off the pipeline connecting the output terminal of the plate heat exchanger 11 and the second delivery pipe network 32, and adjust a flow rate of gaseous refrigerant delivered to the second delivery pipe network 32.

By adopting the foregoing technical solution, in the refrigeration system according to the embodiment of the present application, the outdoor heat exchange module in the standby mode can be switch to the active mode when the outdoor heat exchange module in the active mode fails, thereby ensuring cooling supply of the indoor heat exchange module, improved operation stability and continuous cooling capacity of the refrigeration system.

According to the refrigeration system 1 of the embodiment of the present application, a plurality of outdoor heat exchange modules 20 that can be switched between the active mode and the standby mode are provided, and some of the outdoor heat exchange modules 20 are in the active mode, and the others of the outdoor heat exchange modules 20 are in the standby mode, so that when the outdoor heat exchange module 20 in the active mode fails, the outdoor heat exchange module 20 in the standby mode can be switched to the active mode, thereby ensuring cooling supply of the indoor heat exchange module 10 and improving operation stability of the refrigeration system 1. Furthermore, by enabling the compression device 20a of the outdoor heat exchange module 20 in the standby mode to be in operation, it can avoid the technical problem of insufficient cooling capacity caused by start-up time of the compressor when the outdoor heat exchange module 20 is switched to the active mode, thereby ensuring that the outdoor heat exchange module 20 can reach 100% of the cooling capacity as soon as it switches to the active mode and then ensuring continuous cooling capacity of the refrigeration system 1.

The above-mentioned embodiments are not to be construed as limiting the scope of the present application. It will be apparent to a person skilled in the art that various modifications, combinations, sub-combinations and substitutions are possible, depending on design requirements and other factors. Any modifications, equivalents, and improvements within the spirit and principles of this application are intended to be included within the scope of the present application.

What is claimed is:

1. A refrigeration system, comprising:
an indoor heat exchange module configured for refrigerant to absorb heat; and
a plurality of outdoor heat exchange modules configured for the refrigerant to dissipate heat;
wherein some of the plurality of outdoor heat exchange modules are in an active mode, and the others are in a standby mode;
wherein each of the plurality of outdoor heat exchange modules comprises a compression device and a condensing device; and each of the plurality of outdoor heat exchange modules is switchable between the active mode and the standby mode;
wherein for each of the plurality of outdoor heat exchange modules, in the case where the corresponding outdoor heat exchange module is in the active mode, the corresponding outdoor heat exchange module is connected to the indoor heat exchange module, and in the case where the corresponding outdoor heat exchange module is in the standby mode, the corresponding outdoor heat exchange module is disconnected from the indoor heat exchange module and the compression device of the corresponding outdoor heat exchange module is in an operation status;
wherein the compression device comprises an gas suspension compressor; the gas suspension compressor is connected between an output terminal of the indoor heat exchange module and an input terminal of the condensing device; and
wherein the compression device further comprises a gas supply circulation pipeline connected to the gas suspension compressor; when the corresponding outdoor heat exchange module is in the standby mode, the gas suspension compressor of the corresponding outdoor heat exchange module is connected to the gas supply circulation pipeline of the corresponding outdoor heat exchange module and drives the refrigerant to circulate in the gas supply circulation pipeline of the corresponding outdoor heat exchange module;
wherein each of the plurality of outdoor heat exchange modules further comprises a liquid storage portion; and the liquid storage portion is connected between an output terminal of the condensing device and an input terminal of the indoor heat exchange module, and is configured to store the refrigerant output from the condensing device;
wherein the gas circulation pipeline comprises a liquid conversion portion, a first liquid pump and a gas conversion portion which are sequentially connected in a direction from an output terminal to an input terminal of the gas suspension compressor; the liquid conversion portion is configured to convert the refrigerant output by the gas suspension compressor from a gas state to a liquid state, and deliver the refrigerant to the liquid storage portion; the gas conversion portion is connected between the liquid storage portion and an input terminal of the gas suspension compressor, and is configured to convert the refrigerant in the liquid storage portion from the liquid state to the gas state; the first liquid pump is connected between the liquid storage portion and the gas conversion portion, and is configured to pump the refrigerant in the liquid storage portion to the gas conversion portion; and
wherein both the first liquid pump and the gas suspension compressor are powered by an uninterruptible power system.

2. The refrigeration system of claim 1, wherein the gas supply circulation pipeline further comprises a first on-off valve configured to switch on or off the gas supply circulation pipeline;
wherein a second liquid pump and a second on-off valve are provided between the liquid storage portion and the indoor heat exchange module; the second liquid pump is configured to pump the refrigerant in the liquid storage portion to the indoor heat exchange module; the second on-off valve is configured to switch on or off a refrigerant delivery pipe between the liquid storage portion and the indoor heat exchange module; and
wherein, when the corresponding outdoor heat exchange module is in the active mode, the first on-off valve of the corresponding outdoor heat exchange module is turned off and the second on-off valve of the corresponding outdoor heat exchange module is turned on; and when the corresponding outdoor heat exchange module is in the standby mode, the first on-off valve of the corresponding outdoor heat exchange module is turned on and the second on-off valve of the corresponding outdoor heat exchange module is turned off.

3. The refrigeration system of claim 1, wherein the condensing device comprises:
a condensing coil, an input terminal of the condensing coil being connected to an output terminal of the compression device, and an output terminal of the condensing coil being connected to the input terminal of the indoor heat exchange module; and
a spray device configured to spray cooling water to the condensing coil, so that the refrigerant in the condensing coil is converted from the gas state to the liquid state.

4. The refrigeration system of claim 1, wherein it further comprises:
a refrigerant delivery pipe network, which is connected between the corresponding outdoor heat exchange module and the indoor heat exchange module and is configured to deliver the refrigerant between the corresponding outdoor heat exchange module and the indoor heat exchange module.

5. The refrigeration system of claim 4, wherein the refrigerant delivery pipe network comprises a first delivery pipe network and a second delivery pipe network; an output terminal of the corresponding outdoor heat exchange module is connected with the input terminal of the indoor heat exchange module through the first delivery pipe network; and the output terminal of the indoor heat exchange module is connected with an input terminal of the corresponding outdoor heat exchange module through the second delivery pipe network.

6. The refrigeration system of claim 5, wherein the corresponding outdoor heat exchange module further comprises two on-off valves; one of the two on-off valves is provided between the output terminal of the corresponding outdoor heat exchange module and the first delivery pipe network; and the other of the two on-off valves is provided between the input terminal of the corresponding outdoor heat exchange module and the second delivery pipe network; and wherein, when the corresponding outdoor heat exchange module is in the active mode, the two on-off valves are both tuned on; and when the corresponding outdoor heat exchange module is in the standby mode, the two on-off valves are both turned off.

7. The refrigeration system of claim 5, wherein the indoor heat exchange module comprises a plurality of plate heat exchangers; input terminals of the plurality of plate heat exchangers are connected in parallel to the first delivery pipe network; and output terminals of the plurality of plate heat exchangers are connected in parallel to the second delivery pipe network.

8. The refrigeration system of claim 1, wherein the number of outdoor heat exchange modules is greater than the number of indoor heat exchange modules; among the outdoor heat exchange modules, the number of outdoor heat exchange modules in the active mode is M, and the number of outdoor heat exchange modules in the standby mode is N; and wherein, when $M<6$, $N=1$; when $M≥6$, $N=2$.

9. The refrigeration system of claim 2, wherein the condensing device comprises:

a condensing coil, an input terminal of the condensing coil being connected to an output terminal of the compression device, and an output terminal of the condensing coil being connected to the input terminal of the indoor heat exchange module; and a spray device configured to spray cooling water to the condensing coil, so that the refrigerant in the condensing coil is converted from the gas state to the liquid state.

10. The refrigeration system of claim 2, wherein it further comprises:

a refrigerant delivery pipe network, which is connected between the corresponding outdoor heat exchange module and the indoor heat exchange module and is configured to deliver the refrigerant between the corresponding outdoor heat exchange module and the indoor heat exchange module.

11. The refrigeration system of claim 2, wherein the number of outdoor heat exchange modules is greater than the number of indoor heat exchange modules; among the outdoor heat exchange modules, the number of outdoor heat exchange modules in the active mode is M, and the number of outdoor heat exchange modules in the standby mode is N; and wherein, when $M<6$, $N=1$; when $M≥6$, $N=2$.

12. The refrigeration system of claim 3, wherein the number of outdoor heat exchange modules is greater than the number of indoor heat exchange modules; among the outdoor heat exchange modules, the number of outdoor heat exchange modules in the active mode is M, and the number of outdoor heat exchange modules in the standby mode is N; and wherein, when $M<6$, $N=1$; when $M≥6$, $N=2$.

* * * * *